United States Patent
Matsuura

(10) Patent No.: US 9,991,160 B2
(45) Date of Patent: Jun. 5, 2018

(54) PROCESS OF FORMING SEMICONDUCTOR DEVICE HAVING INTERCONNECTION FORMED BY ELECTRO-PLATING

(71) Applicant: SUMITOMO ELECTRIC DEVICE INNOVATIONS, INC., Yokohama, Kanagawa (JP)

(72) Inventor: Kazuaki Matsuura, Kanagawa (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 0 days. days.

(21) Appl. No.: 15/635,937

(22) Filed: Jun. 28, 2017

(65) Prior Publication Data
US 2017/0372955 A1 Dec. 28, 2017

(30) Foreign Application Priority Data
Jun. 28, 2016 (JP) ................................. 2016-127424

(51) Int. Cl.
| | | |
|---|---|---|
| H01L 29/06 | (2006.01) | |
| H01L 21/768 | (2006.01) | |
| H01L 21/3213 | (2006.01) | |
| H01L 21/288 | (2006.01) | |

(52) U.S. Cl.
CPC .... *H01L 21/76885* (2013.01); *H01L 21/2885* (2013.01); *H01L 21/32136* (2013.01); *H01L 21/32139* (2013.01); *H01L 21/76873* (2013.01); *H01L 29/0696* (2013.01)

(58) Field of Classification Search
CPC ....... H01L 2924/00; H01L 2224/32225; H01L 2924/01029; H01L 24/11; H05K 3/108
See application file for complete search history.

(56) References Cited

U.S. PATENT DOCUMENTS

| | | | | |
|---|---|---|---|---|
| 6,426,281 B1 * | 7/2002 | Lin | ......................... | H01L 24/11 |
| | | | | 257/E21.508 |
| 6,642,136 B1 * | 11/2003 | Lee | ....................... | H01L 21/563 |
| | | | | 257/E21.503 |
| 6,723,571 B2 | 4/2004 | Furukawa | | |
| 8,440,272 B2 * | 5/2013 | Lin | ......................... | H01L 22/22 |
| | | | | 257/E21.523 |
| 2011/0049706 A1 * | 3/2011 | Huang | ..................... | H01L 24/11 |
| | | | | 257/737 |

FOREIGN PATENT DOCUMENTS

JP          06-351762          12/2006

* cited by examiner

*Primary Examiner* — Jaehwan Oh
(74) *Attorney, Agent, or Firm* — Smith, Gambrell & Russell, LLP.

(57) ABSTRACT

A process of forming a semiconductor device that includes an interconnection formed by electro-plating is disclosed. The process comprises steps of: forming a stopper layer on a first insulating film; covering the stopper layer and the first insulating film with a second insulating film; preparing a first mask having an edge that overlaps with the stopper layer; depositing a seed layer on the first mask and the second insulating film that is exposed from the first mask; preparing a second mask having an edge that overlaps with the stopper layer, the edge of the first mask being retreated from the edge of the second mask; forming an upper layer on the seed layer by electro-plating a metal so as not to overlap with the first mask; and removing the seed layer exposed from the upper layer by etching.

18 Claims, 9 Drawing Sheets

PROCESS OF FORMING SEMICONDUCTOR DEVICE HAVING INTERCONNECTION FORMED BY ELECTRO-PLATING

CROSS REFERENCE TO RELATED APPLICATIONS

The present application claims the benefit of priority of Japanese Patent Application No. 2016-127424, filed on Jun. 28, 2016, which is incorporated herein by reference.

BACKGROUND OF THE INVENTION

Field of the Invention

The present application relates to a process of forming a semiconductor device.

Related Background Arts

A semiconductor manufacturing process has widely used an etching using an etching mask to form via holes in insulating materials and patterned electrically conductive materials. A semiconductor device is also necessary to have moisture resistance. Moisture or water easily invades within the device through boundaries between the electrically conductive materials, typically metals and insulating films covering and surrounding the metals. When the metals provide overhangs or complex structures, the insulating films are hard to cover the metals securely. A process of electro-plating sometimes causes an overhang in a metal interconnection, or a process of removing a seed layer after the electro-plating is likely to cause damage in an insulating film beneath the seed layer. Such an insulating film insufficiently covering the metal and an insulating film receiving damage degrade the moisture resistance of the device.

SUMMARY OF THE INVENTION

An aspect of the present invention relates to a process of forming a semiconductor device that is provided on a substrate. The semiconductor device has a source electrode, a drain electrode, a gate electrode, a first insulating film that covers the drain, source, and the gate electrodes. The process comprises steps of: (1) forming a stopper layer on the first insulating film; (2) covering the stopper layer and the first insulating film with a second insulating film; (3) preparing a first mask having an edge that overlaps with the stopper layer; (4) depositing a seed layer on the first mask and the second insulating film that is exposed from the first mask; (5) preparing a second mask having an edge that overlaps with the stopper layer, the edge of the first mask retreating from the edge of the second mask; (6) forming an upper layer on the seed layer by electro-plating a metal so as not to overlap with the first mask; and (7) removing the seed layer exposed from the upper layer by etching.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, embodiment according to the present invention will be described as referring to drawings. In the description of the drawings, numerals or symbols same with or similar to each other will refer to elements same with or similar to each other without duplicating explanations.

First Embodiment

Figures 1A, 1B:
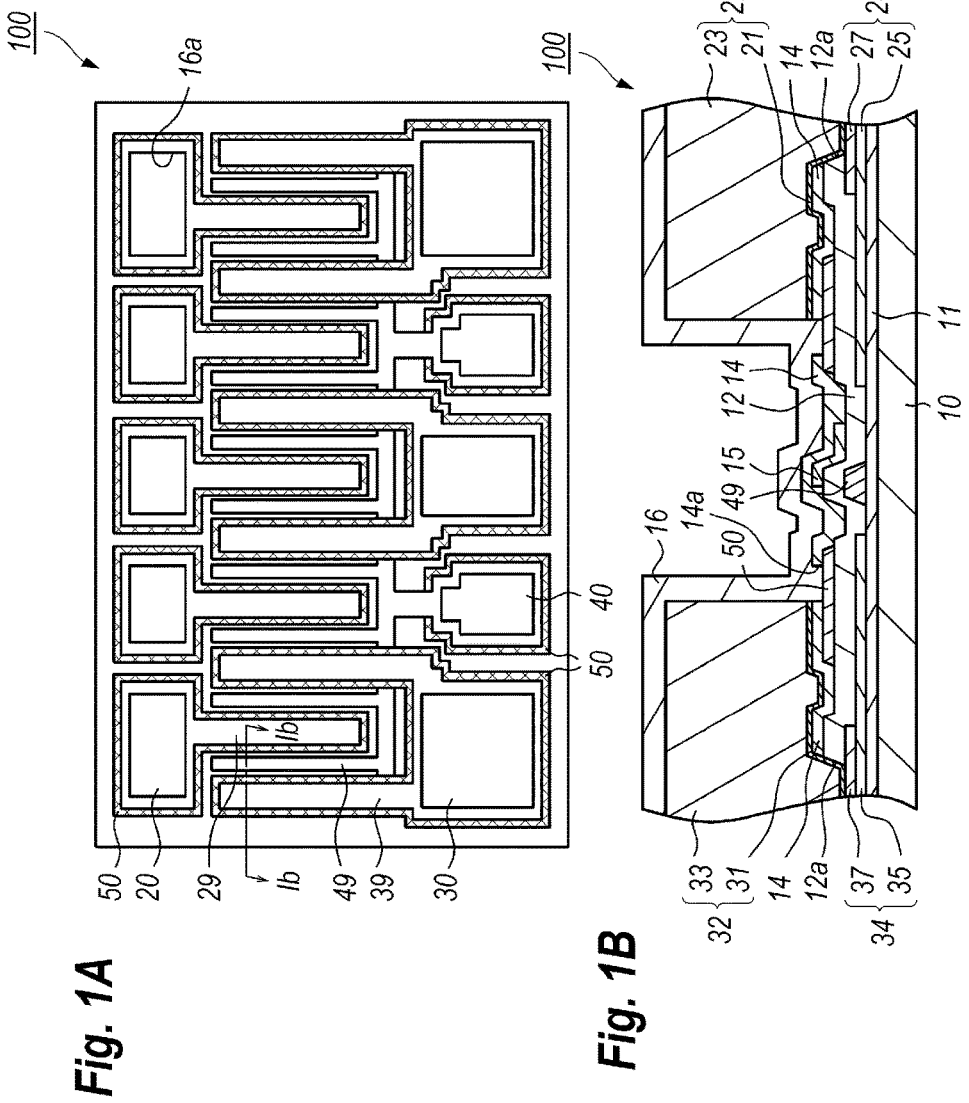
FIG. 1A is a plan view of a semiconductor device according to the first embodiment of the present invention.
FIG. 1B shows a cross section taken along line Ia-Ia indicated in FIG. 1A.

FIG. 1A is a plan view showing a semiconductor device 100, while, FIG. 1B shows a cross section of the semiconductor device 100 taken along the line Ib-Ib indicated in FIG. 1A. The semiconductor device 100 is a type of field effect transistor (FET) including pads of the drain, source, and gate, 20, 30, and 40, respectively, and fingers of the drain, the source, and the gate, 29, 39, and 49, respectively. The drain fingers 29 extend from the respective drain pads 20, the source fingers 39 extend from the respective source pads 30, and the gate fingers 49 extend from the respective gate pad 40. The specification herein below sometimes calls the drain pads 20, the source pads 30, and the gate pads 40 collectively as a pad, while, the drain fingers 29, the source fingers 39, and the gate fingers 49 collectively as a finger. A feature of the semiconductor device 100 shown in FIG. 1A is that stopper layer 50 surround the pad, the drain fingers 29, and the source fingers 39.

The semiconductor device 100, as FIG. 1B illustrates, provides a substrate 10 that may be made of silicon carbide (SiC), sapphire ($Al_2O_3$), and so on. Provided on the substrate 10 is a semiconductor stack 11 that includes a channel layer made of gallium nitride (GaN), a barrier layer made of aluminum gallium nitride (AlGaN). The semiconductor stack 11 in areas where the pads, 20 to 40, are formed are inactivated, while those in rest areas where the fingers, 29 to 49, are formed are left as active areas.

Provided on the semiconductor stack 11 in the active area are drain electrodes 24, source electrodes 34, and gate fingers 49. The drain electrodes 24 each include a lower layer 25 and an upper layer 27, while, the source electrodes each include a lower layer 35 and an upper layer 37, where the lower layers, 25 and 35, make non-rectifier contacts against the semiconductor stack 11, while, the upper layers, 27 and 37, may be operable as barrier layers for suppressing inter-diffusions of atoms contained in the lower layers, 25 and 35, and those contained in layers to be provided on the upper layers, 27 and 37. The lower layers, 25 and 35, may be made of stacked metals of tantalum (Ta), aluminum (Al) and tantalum (Ta), and the upper layers, 27 and 37, may made of staked metal of titanium (Ti) with a thickness of 10 nm, titanium tungsten nitride (TiWN) with a thickness of 200 nm, and titanium tungsten (TiW) with a thickness of 100 nm. Provided on the upper layers, 27 and 37, are interconnections, 22 and 32, respectively. The drain electrodes 24 and the interconnections 22 form the drain fingers 29 and the drain pads 20, while, the source electrodes 34 and the interconnections 32 form the source fingers 39 and the source pads 30.

The gate fingers 49, which make a rectifier contact against the semiconductor stack 11, may be made of stacked metal of nickel (Ni), palladium (Pd), and gold (Au).

The drain and source electrodes, 24 and 34, and the gate fingers 49 are covered with the first insulating film 12. Provided on the first insulating film 12 and overlapping with the gate fingers 49 are source wall 15 that are made of stacked metals of titanium (Ti) with a thickness of 5 nm and gold (Au) with a thickness of 200 nm. The first insulating film 12 provides openings 12a through which the drain and source electrodes, 24 and 34, expose.

The semiconductor device 100 provides stopper layer 50 on the first insulating film 12 and apart from the openings 12a, specifically, between the gate fingers 49 and the openings 12a. The stopper layer 50 overlap with the drain and source electrodes, 24 and 34; while, the interconnections, 22 and 33, in edges thereof overlap with the stopper layer 50. The stopper layer 50 also overlaps with edges of the respective pads, 20 to 40. The stopper layer 50 may be made of stacked metals of titanium (Ti) with a thickness of 5 nm, gold (Au) with a thickness of 150 nm, and titanium (Ti) with a thickness of 5 nm. The stopper layer is electrically isolated from the pads, 20 to 40, and the fingers, 29 and 39.

Provided on the first insulating film 12, the stopper layer 50, and the source wall 15 is a second insulating film 14. That is, the second insulating film 14 effectively covers the whole of the semiconductor device 100 but provides openings so as to expose the upper layers, 27 and 37, in the drain and source electrodes, 24 and 34, and portions of the stopper layer 50.

The interconnections, 22 and 32, include seed layers, 21 and 31, as lower layers. The seed layers, 21 and 31, are in direct contact with the upper layers, 27 and 37, of the drain and source electrodes, 24 and 34, which are exposed within the openings in the second insulating film 14. Metal layers, 23 and 33, are provided on the seed layers, 21 and 31, as upper layers, where the metal layers, 23 and 33, are formed by plating by the seed layers, 21 and 31, as the seed metals. The interconnections, 22 and 32, fill the openings 12a in the first insulating film 12 and the openings in the second insulating film 14, and extend above the stopper layer 50 as interposing the second insulating film 14 therebetween. The interconnections, 22 and 32, in the edges thereof in sides of the respective gate fingers 49 overlap with the stopper layer 50.

The seed layers, 21 and 31, may be made of stacked metals of titanium (Ti) with a thickness of 10 nm, titanium tungsten (TiW) with a thickness of 100 nm, another titanium (Ti) with a thickness of 10 nm, and gold (Au) with a thickness of 100 nm. While the upper layers, 23 and 33, formed by plating may be made of gold (Au) with a thickness of 3 μm.

The drain pads 20 stack the drain electrode 24 with the interconnections 22. Similarly, the source pads 30 stack the source electrodes 34 with the interconnections 32. The gate pads 40 stack layers having an arrangement same with the gate fingers 49 with an interconnection having an arrangement same with those of the interconnections, 22 and 32. The stopper layer 50, as FIG. 1A indicate, surround the pads, 20 to 40, of the drain, source, and gate, respectively, and the drain fingers, 29 and the source fingers 39.

Provided on the interconnections, 22 and 32, on the stopper layer 50 exposing between the interconnections, 22 and 32, and the second insulating films 14, and on the second insulating film 14 are third insulating film 16. That is, the third insulating film 16 effectively covers the whole surface of the semiconductor device 100 except for respective centers of the pads, 20 to 40.

The first to third insulating films, 12 to 16 may be made of silicon nitride (SiN) with a thickness of 200 nm, that with a thickness of 400 nm, and that with a thickness of 600 nm, respectively. The third insulating film 16 provides openings 16a that expose the pads, 20 to 40.

Process of Forming Semiconductor Device

Next, a process of forming the semiconductor device 100 will be described as referring to FIGS. 2A to 4B showing cross sections at respective steps of the process. Although the explanation below concentrates of the arrangement around the source finger 39 and the gate finger 49, but the explanation may be applied to the arrangement around the drain finger 29.

The process first grows semiconductor stack 11 on the substrate 10 by a conventional metal organic chemical vapor deposition (MOCVD) technique. Then, an implantation of heavy ions such as argon (Art) into the semiconductor stack 11 may form the inactive region where the pads, 20 to 40, are to be formed. In an alternative, removing the semiconductor stack 11 in the region corresponding to the pads, 20 to 40, may also form the inactive region. Rest regions not implanted with ions, or not etched; leave the semiconductor stack 11 as the active region.

Then, a metal evaporation with a subsequent lift-off technique may form the lower layer 35 on the semiconductor stack 11; and subsequent sputtering may form the upper layer 37 of the source electrode 34. The gate finger 49 is formed between the drain and source electrodes, 24 and 34, by the metal evaporation accompanied with the subsequent lift-off technique. Then, the plasma assisted chemical vapor deposition (p-CVD) may deposit the first insulating film 12 so as to cover the source electrode 34 and the gate finger 49. Then, the opening 12a is formed in the first insulating film 12 so as to expose the upper layer 37 in the source electrode 34.

Figure 2A:
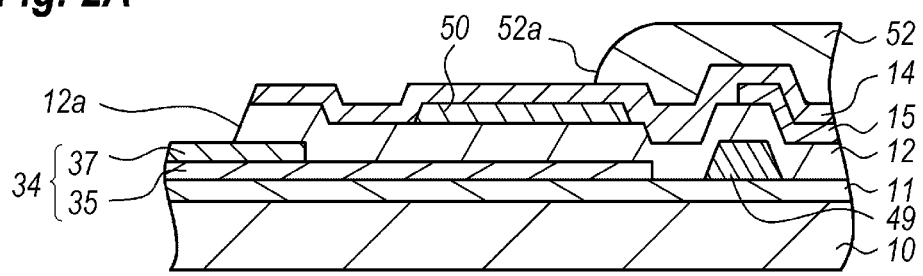
FIGS. 2A to 2C show cross sections of the semiconductor device at respective manufacturing steps thereof.

The metal evaporation and subsequent lift-off technique may form the source wall 15 and the stopper layer 50 on the first insulating film 12. In the present process, the source wall 15 and the stopper layer 50 may have the arrangement same with each other. Thereafter, the second insulating film 14 formed by the p-CVD technique may fully cover the first insulating film 12, the source wall 15, the stopper layer 50, and the upper layer 37 exposed within the opening 12a in the first insulating film 12. An opening may be formed in a position corresponding to the opening 12a in the first insulating film 12. Or, the process may continuously form the opening 12a in the second and first insulating films, 14 and 12, after the formation of the second insulating film 14. Then, a patterned photoresist 52 partially covers the second insulating film 14. Specifically, the patterned photoresist 52 exposes the openings 12a in the first insulating film 12 and overlaps with the gate finger 49 and the source wall 15. The photoresist 52 has an edge 52a above the stopper layer 50, or overlaps with the stopper layer 50, which is shown in FIG. 2A. The photoresist 52 is hard baked after the development thereof to form the edge 52a thereof in dull.

Figure 2B:
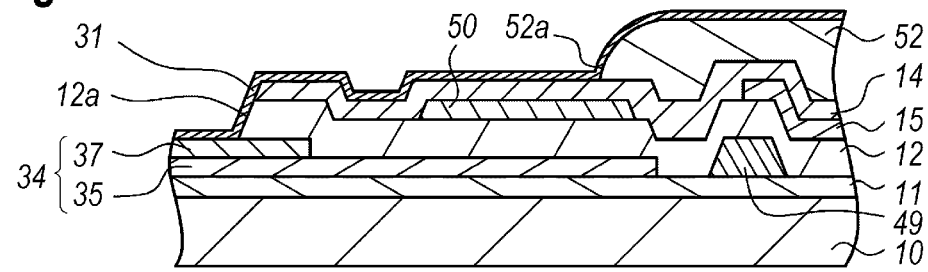

Thereafter, the seed layer 31 formed by sputtering covers the upper layer 37 exposing in the opening 12a of the insulating films, 12 and 14, the second insulating film 14 between the photoresist 52 and the opening 12a, and the photoresist 52, as shown in FIG. 2B.

Figure 2C:
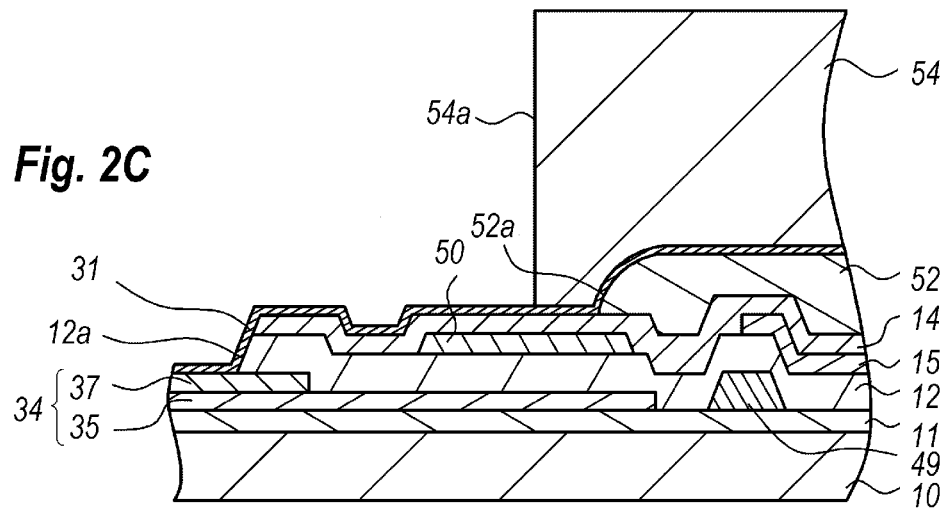

As shown in FIG. 2C, another patterned photoresist 54, the second photoresist, covers the former photoresist 52 on the seed layer 31 so as to expose the openings 12a. The photoresist 54 in an edge 54a thereof locates above the stopper layer 50 and closer to the opening 12a compared with the edge 52a of the first photoresist 52. The edge 54a of the second photoresist 54 positions between the edge 52a of the first photoresist 52 and the opening 12a, which is shown in FIG. 2C. That is, the first photoresist 52 in the edge 52a thereof is retreated from the edge 54a of the second photoresist 54, but the edges, 52a and 54a, locate within the stopper layer 50.

Figure 3A:
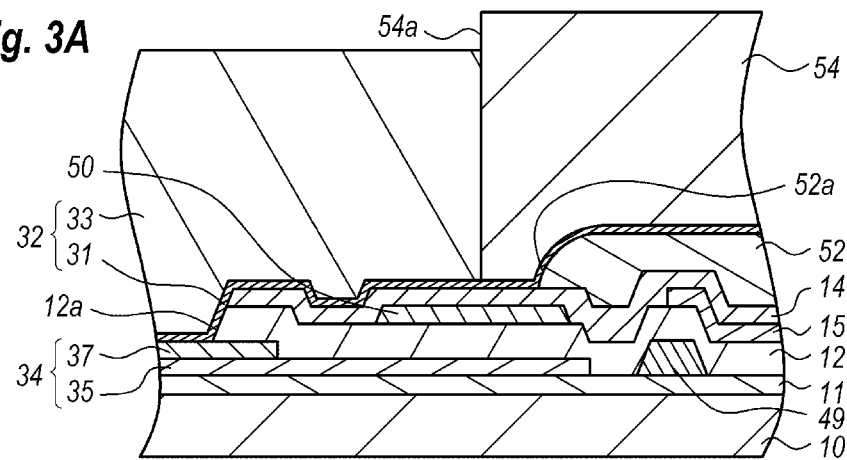
FIGS. 3A to 3C show cross sections of the semiconductor device at respective manufacturing steps thereof subsequent to that shown in FIG. 2C.
Figure 3B:
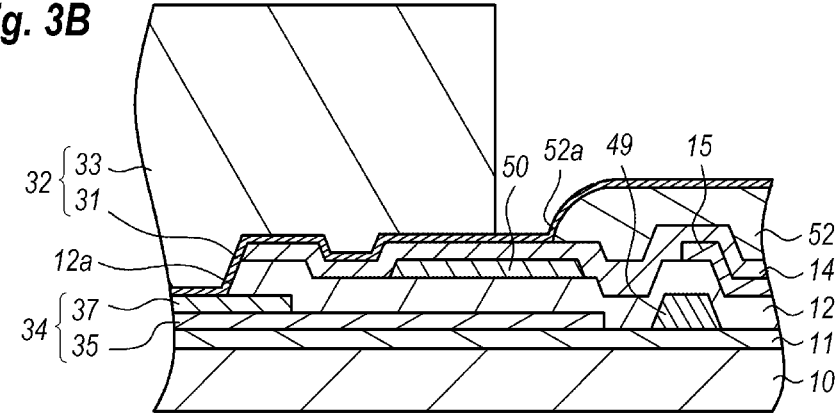
Figure 3C:
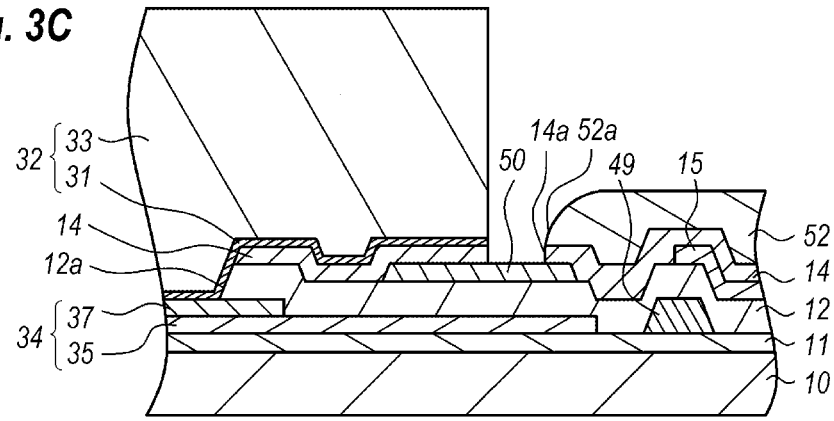
Figure 4A:
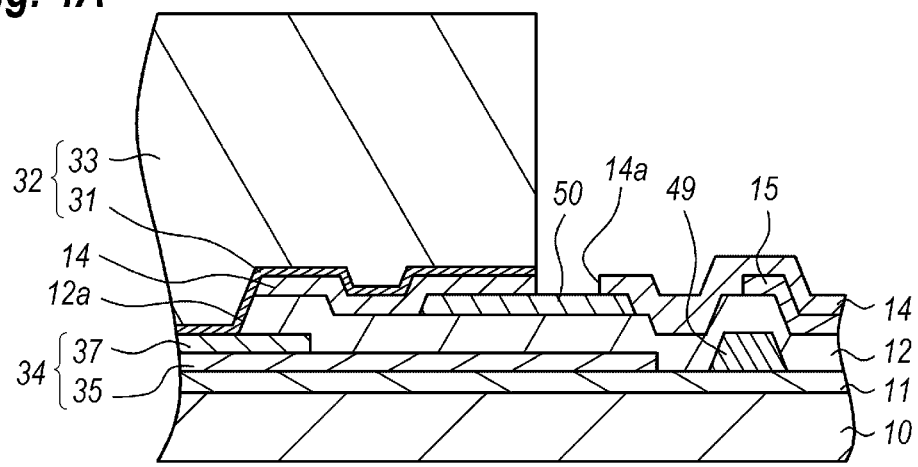
FIGS. 4A and 4B show cross sections of the semiconductor device at respective manufacturing steps thereof subsequent to that shown in FIG. 3C.

The upper layer 33 of the interconnection 32 is electroplated by the seed layer 31 as the seed metal. The upper layer 33 is selectively formed on the seed layer 31 exposed from the second photoresist 54. The upper layer 33 is in contact with the edge 54a of the second photoresist 54 but apart from the edge 52a of the first photoresist 52, as shown in FIG. 3A. Then, as FIG. 3B illustrates, the process sequentially removes the second photoresist 54 and exposes the seed layer 31 on the first photoresist 52 and the seed layer 31 on the second insulating film 14 by, for instance, physical etching such as the ion milling using argon ions. Specifically, the ion milling may etch an Au layer in the seed layer 31 and a top portion of the upper layer 33, which is made of gold (Au), and a dry etching, such as reactive ion etching (RIE) using a reactive gas source, subsequently carried out may remove refractory metals contained in lower portions of the seed layer 31, which exposes the first photoresist 52 and the second insulating film 14 between the first photoresist 52 and the upper layer 33. Because the second insulating film 14 shows etching tolerance against the RIE comparable to the refractory metal in the seed layer 31, the RIE possibly etches a portion of the second insulating film 14 that is exposed between the first photoresist 52 and the interconnection 32 after the removal of the seed layer 31, or sometimes fully etches the second insulating film 14 to form an opening 14a, as shown in FIG. 3C. However, because the stopper layer 50 has etching tolerance against the RIE compared with that of the second insulating film 14, the etching effectively stops at the stopper layer 50 and exposes the stopper layer 50. Removing the first photoresist 52 with a solvent, the second insulating film 14 may be exposed as shown in FIG. 4A. Finally, the third insulating film 16 covers the interconnection 32, the stopper layer 50 between the interconnection 32 and the second insulating film 14, and the second insulating film 14 is covered with the third insulating film 16 formed by the p-CVD.

First Example Comparable to Invention

Figure 5A:
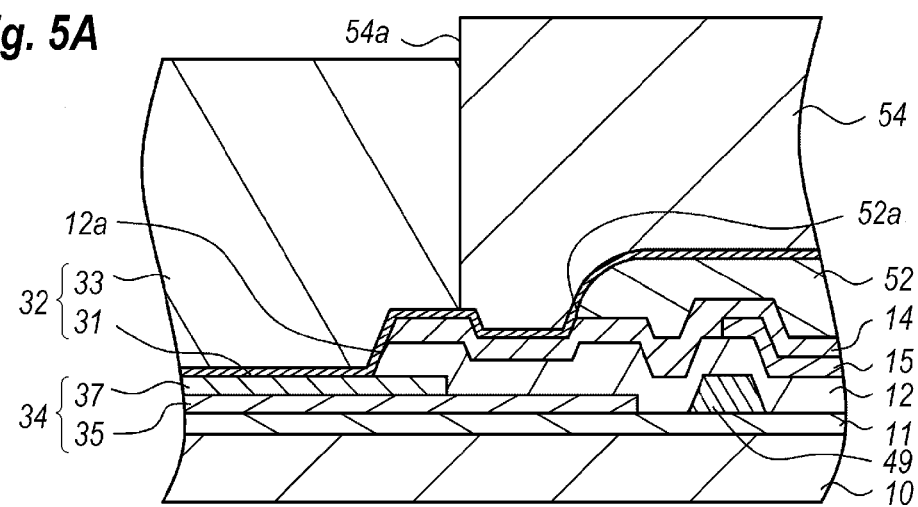
FIGS. 5A and 5B show cross sections of a semiconductor device at respective manufacturing steps where the semiconductor device shown in FIGS. 5A and 5B is comparable with the semiconductor device of the present embodiment.
Figure 5B:
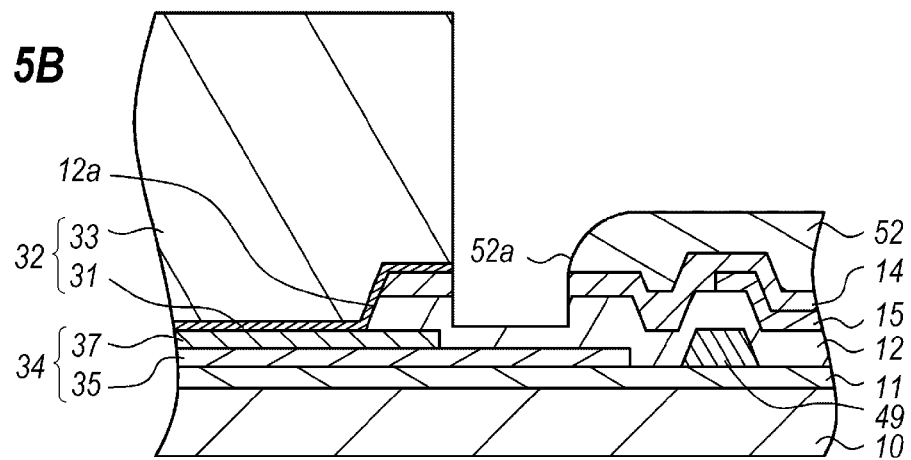
Figure 6A:
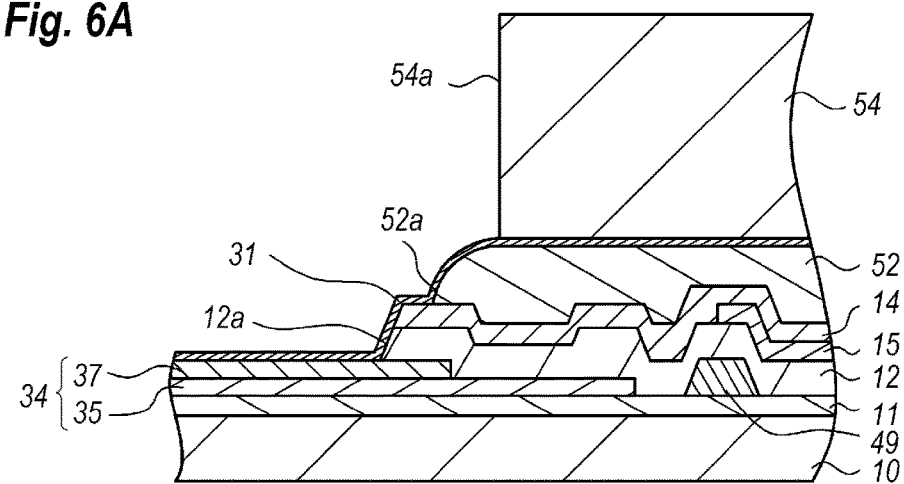
FIGS. 6A and 6B show cross sections of another semiconductor device at respective manufacturing steps where the semiconductor device shown in FIGS. 6A and 6B is also comparable with the semiconductor device of the present embodiment.
Figure 6B:
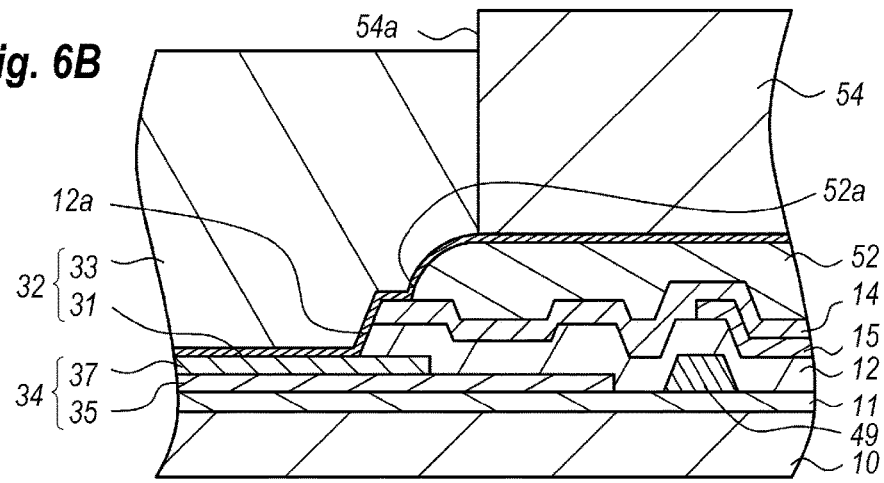

Next, an example that is comparable to the present invention will be described as referring to FIGS. 5A and 5B that show cross sections of a semiconductor device at respective manufacturing steps thereof, where the semiconductor device is according to an example that is comparable to the present invention. As FIG. 5A shows, the comparable semiconductor device omits the stopper layer 50 on the first insulating film 12 and around the ohmic electrodes, 24 and 34. After the deposition of the upper layer 33 by plating, the process removes the second photoresist 54 and etches the seed layer 31. Because the seed layer 31 is made of material that is hard to be reactively or chemically etched, the seed layer 31 is removed by physically removing technique such as the ion-milling. However, such a physical etching technique generally shows etching rates comparable to each other. Accordingly, as FIG. 5B shows, the physical etching technique possibly etches the second and first insulating films, 12 and 14, between the upper layer 33 and the first photoresist 52. Thinned insulating films, 12 and 14, show lessor tolerances against the invasion of moisture.

Second Example Comparable to Invention

FIGS. 6A to 7B show cross sections of a semiconductor device according to the second example comparable to the present invention. The semiconductor device of the second example also provides no stopper layer 50, and the second photoresist 54 retreats from the edge of the first photoresist 52 toward the side opposite to the opening 12a. Plating the upper layer 33 by the seed layer 31, which is shown in FIG. 6B, and sequentially removing the second photoresist 54, the seed layer 31, and the first photoresist 52, without etching the second and first insulating films, 14 and 12, the interconnection 32 has an undercut 32a because the first photoresist 52 fully covers the second and first insulating films, 14 and 12, during the process of removing the seed layer 31. In other words, because the second photoresist 54 retreats from the edge 52a of the first photoresist 52, or the second photoresist is fully overlapped with the first photoresist 52, only a portion of the seed layer 31 exposed from the upper layer 33 may be removed by the physical etching. The first photoresist 52 always exists beneath the seed layer 31 that is to be physically etched. Accordingly, even the physical etching is carried out for removing the seed layer 31; the first photoresist 52 always exits thereunder and may protect the second and first insulating films, 14 and 12.

Figure 7A:
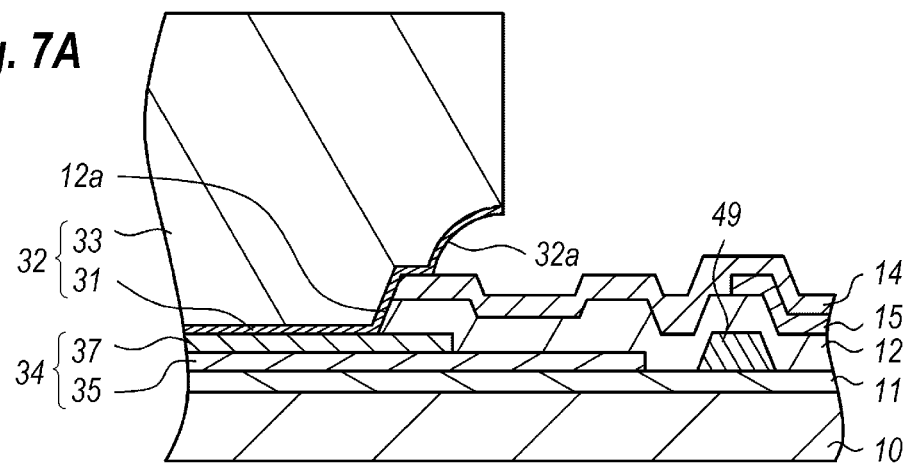
FIGS. 7A and 7B show cross sections of the semiconductor device at respective manufacturing steps subsequent to the process shown in FIG. 6B.
Figure 7B:
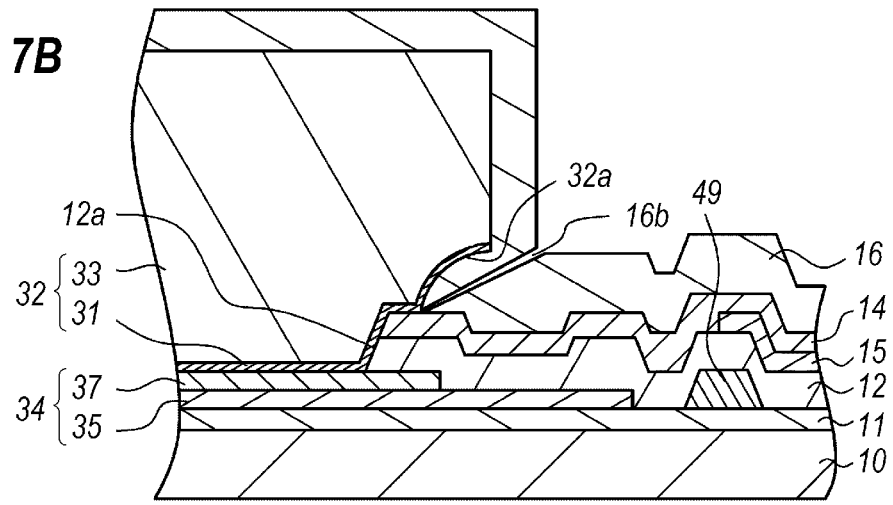

However, as FIG. 7A shows, the cross section of the interconnection 32 is forced to have an undercut 32a or an overhang 32a between the seed layer 31 and the second insulating film 14 after removing the first photoresist 52. Depositing the third insulating film 16 after the removal of the first photoresist 52 to protect the whole surface of the semiconductor device, the third insulating film 16 possibly degrades quality thereof beneath the undercut 32a or possibly exposes the surface of the second insulating film 14 and/or the bottom surface of the seed layer 31 because of lessor coverage of the SiN film beneath the overhang 32a. Thus, a crack 16b beneath the undercut 32a may be induced, which may enhance the invasion of moisture, resultantly, causes corrosion in the electrodes, and short-circuits between the electrodes.

Examples thus described, which are comparable to the present invention, possibly degrades the moisture resistance of the device because the second and first insulating films, 14 and 12, are removed during the removal of the seed layer 31 in the first one, or because the lessor coverage of the third insulating film 16 under the overhang 32a in the second one.

On the other hand, the semiconductor device 100 of the first embodiment has an arrangement where the interconnection 32 in the upper layer 33 thereof is plated after the second photoresist 54 fully covers the first photoresist 52, which means that the upper layer 33 is plated so as to be apart from the first photoresist 52 and forms no overhang 32a, which may not degrade the coverage of the third insulating film 16 and enhance the moisture resistance thereof.

The fact that the interconnection 32 forms no overhang 32a resultantly means that the physical etching for the seed layer 31 exposes and removes the second insulating film 14 between the first photoresist 52 and the upper layer 33. However, because the stopper layer 50 exists beneath the second insulating film 14 exposed between the first photoresist 54 and the upper layer 33; accordingly, the stopper layer 50 may effectively protect the first insulating film 12 from being physically etched. Thus, because the first insulating film 12 may be left unchanged, the moisture resistance of the device may be maintained.

As described, the seed layer 31 is made of a stacked metal of titanium (Ti) and gold (Au). Accordingly, the process first removes Au layer by the physical etching of the ion milling, then, Ti layer is removed by the chemical etching, such as the reactive ion etching (RIE) using fluorine (F) as a reactive gas source. The RIE, in particular, that using fluorine (F) may also etch the insulating films, 14 and 12, made of silicon nitride (SiN) and/or silicon oxide (SiO$_2$). Providing the stopper layer 50 on the first insulating film 12, the stopper layer 50 may effectively protect the first insulating film 12 from being etched during the etching of the seed layer 31 by the RIE. The stopper layer 50 may have tolerance against the RIE using fluorine (F) almost twice of the insulating films, 12 and 14. Thus, even the second insulating film 14 is fully etched during the removal of Ti layer in the seed layer 31; the first insulating film 12 is left un-etched.

The stopper layer 50 may be made of a stacked metal of titanium (Ti) and gold (Au) provided on the Ti layer and another Ti layer provided on the Au layer. The gold (Au) layer may show the etching tolerance against the RIE using fluorine (F). The upper and lower Ti layers may enhance the adhesion against the second insulating film 14 and the first insulating film 12, respectively. When the second insulating film 14 has a thickness of 200 nm, the stopper layer 50, exactly the Au layer between the Ti layers, has a thickness of at least 150 nm to effectively protect the first insulating film 12. When the stopper layer 50 contains a material showing enhance etching tolerance for the RIE using fluorine (F), the stopper layer 50 may be further thinned. The Ti layers in the bottom and the top of the stopper layer 50, as described above, may enhance the adhesion of the stopper layer 50 against the second and the first insulating films, 14 and 12, which may enhance the moisture resistance of the device.

The upper layer 33 in the interconnection 32 provides an edge thereof overlapping with the stopper layer 50, and the first photoresist 52 has the edge 52a also overlapping with the stopper layer 50, which means that the second insulating film 14 in the portion exposed during the removal of the seed layer 31 always overlaps with the stopper layer 50.

The stopper layer 50 may be formed concurrently with the formation of the source wall 15, and may have an arrangement same with that of the source wall 15, that is, the source wall 15 and the stopper layer 50 may have the stacked metal of titanium (Ti), gold (Au), and another Ti. In an alternative, the top Ti layer may be replaced by tantalum (Ta). In another alternative, the stopper layer 50 may have an arrangement of a stack of nickel (Ni) and gold (Au), tantalum (Ta) and gold (Au), and so on. The stopper layer 50 may be formed independent of the source wall. In such a case, the stopper layer may contain a material showing further enhanced tolerance against the RIE using fluorine (F).

The stopper layer 50 is not connected to anywhere, that is, the stopper layer is electrically floated which shows an advantage for the invasion of charged water, or charged moisture, into the device. The device 100 provides the first and the second insulating films, 12 and 14, where the second insulating film 14 provides the interconnection 32 thereon. Moreover, the third insulating film 16 covers the second insulating film 14 and the interconnection 32. Accordingly, the third insulating film 16 may suppress the invasion of the moisture from the interface between the interconnection 32 and the second insulating film 14. Although FIG. 3C exposes the top of the stopper layer 50, a portion of the second insulating film 14 may cover the top of the stopper layer 50. An important point is that the RIE using fluorine (F) may completely etch or remove the seed layer 31 and the stopper layer 50 may be fully removed in the portion exposed from the interconnection 32 without exposing the first insulating film 12.

Second Embodiment

A semiconductor device 100A according to the second embodiment of the present invention also provides the stopper layer 50A but electrically un-floated different from that of the first embodiment. FIGS. 8A to 9B show cross sections of the semiconductor device 100A at respective manufacturing steps thereof.

Figure 8A:
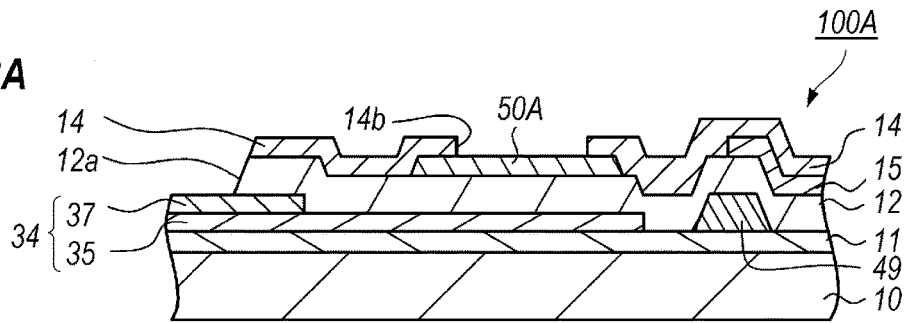
FIGS. 8A to 8D show cross sections of the semiconductor device at respective manufacturing steps, where the semiconductor device is the second embodiment of the present embodiment.
Figure 8B:
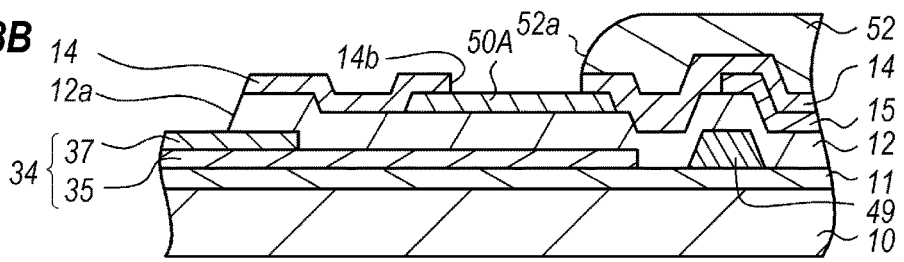

After the deposition of the first insulating film 12, the process forms the stopper layer 50A thereof, then, the surface of the first insluting film 12, the stopper layer 50A, and the source wall 15 if exists are covered with the second insulating film 14. Then, the opening 12a in the first and second insulating films, 14 and 12, and an opening 14b are concurrently formed, where the latter opening 14b overlaps with the stopper layer 50A. Thus, the stopper layer 50A and the upper layer 37 in the source electrode 34 expose within the openings, 12a and 14b. Then, the first photoresist 52 covers the second insulating film 14 in a region corresponding to the gate finger bur exposes the openings, 12a and 14b, in the insulating films, 12 and 14, and the second insulating film 14 between the openings, 12a and 14b, which is shown in FIG. 8B.

Figure 8C:
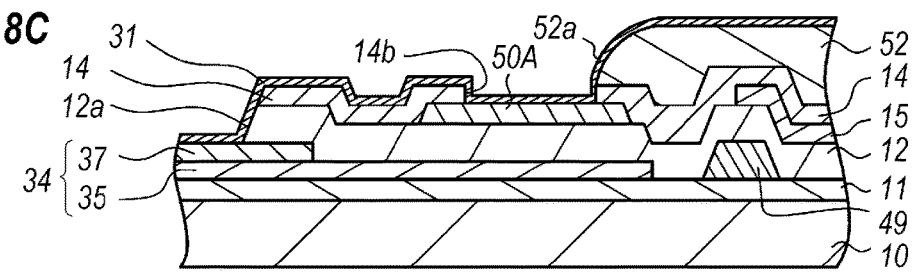
Figure 8D:
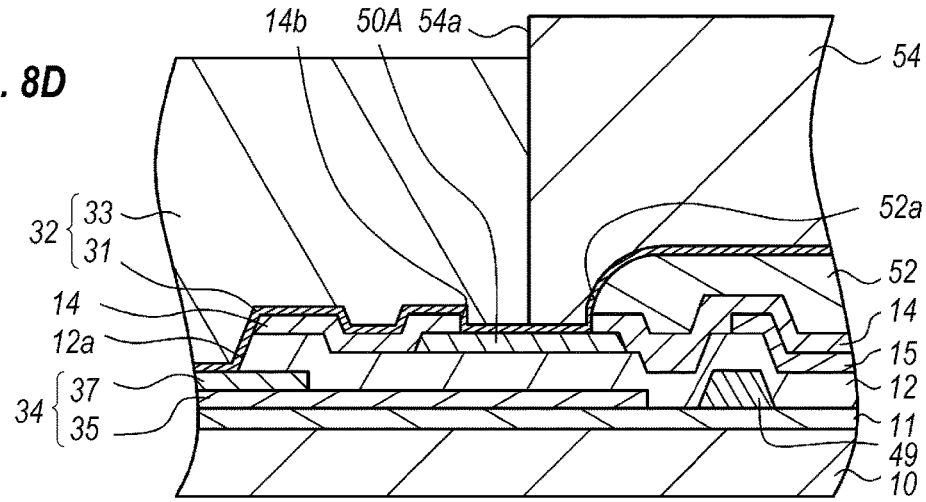

The seed layer 31 is deposited on the whole surface of the semiconductor device 100A, that is, the first photoresist 52, the openings, 12a and 14b, and the second insulating film 14 between the openings, 12a and 14b, are covered with the seed layer 41, as shown in FIG. 8C. Then, the second photoresist 54 is formed such that the edge 54a thereof overlaps with the stopper layer 50A and the first photoresist 52 in the edge 52a is retreated from the edge 54a of the second photoresist 54. That is, the second photoresist 54 fully covers the first photoresist 52, FIG. 8D.

The upper layer 33 is plated by the second photoresist 54 as the mask and the seed layer 31 as the seed metal. Then, removing the second photoresist 54 and the seed layer 31 exposed from the upper layer 33 in the interconnection 32, including a portion on the first photoresist 52 and between the first photoresist 52 and the upper layer 44 by physical etching such as the ion milling, the stopper layer 50A exposes between the first photoresist 52 and the upper layer 33. A SiN film is deposited on the whole surface of the device 100A after removing the first photoresist, that is, the interconnection 32, the second insulating film 14, and the stopper layer 50 between the second insulating film 14 and the upper layer 33 are covered with the third insulating film 16.

Figure 4B:
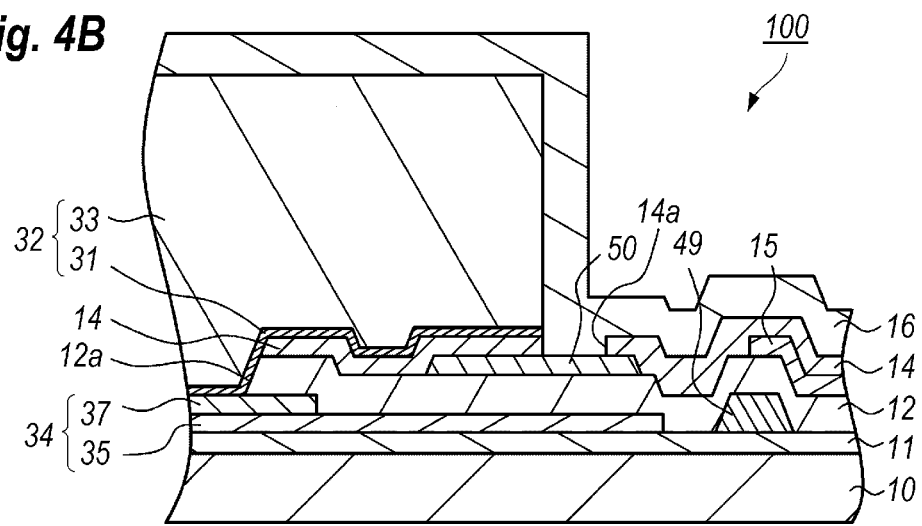
Figure 9A:
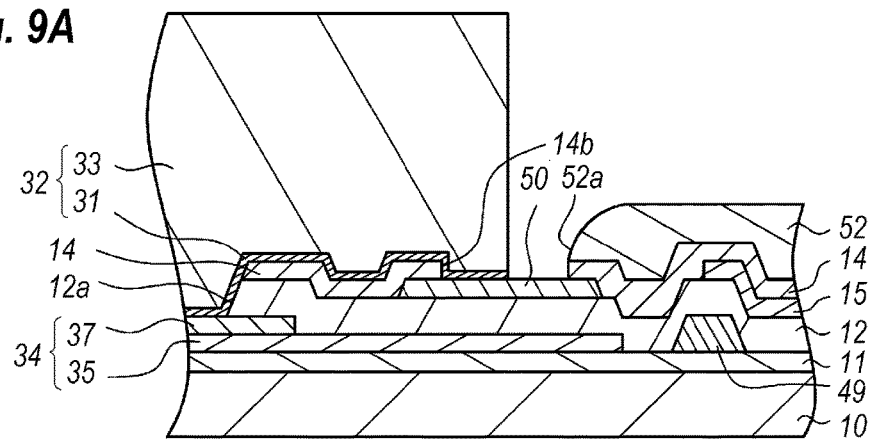
FIGS. 9A and 9B show cross sections of the semiconductor device at respective manufacturing steps subsequent to that shown in FIG. 8B.
Figure 9B:
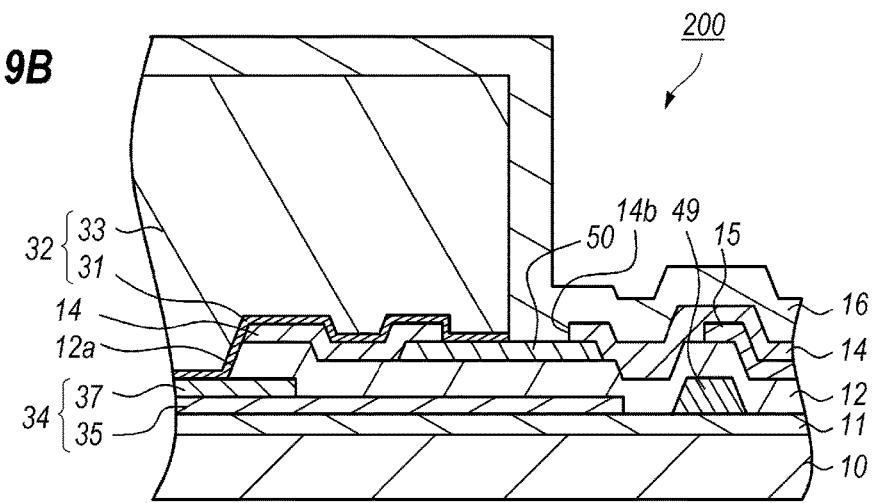

The semiconductor devices, 100 and 100A, of the present invention have final structures each shown in FIGS. 4B and 9B substantially same with each other except for the seed layer 31 is in direct contact with the stopper layer 50A in the second embodiment shown in FIG. 9B, while, the seed layer 31 is in contact with the stopper layer 50 as interposing the second insulating film 14 therebetween. Accordingly, the semiconductor device 100A may show an enhanced moisture resistance comparable to that shown in the semiconductor device 100 of the first embodiment.

The semiconductor devices, 100 and 100A of the present invention may provide the insulating films, 12 to 16, made of silicon oxide ($SiO_2$), silicon oxy-nitride (SiON), and so on except for silicon nitride (SiN). Also, although the embodiment concentrates on the semiconductor devices made of nitride semiconductor materials or arsenide semiconductor materials, such as gallium nitride (GaN), aluminum gallium nitride (AlGaN), indium gallium nitride (InGaN), indium nitride (InN), and indium aluminum gallium nitride (InAlGaN) as the former material, while, gallium arsenide (GaAs), aluminum gallium arsenide (AlGaAs) and so on as the latter material.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A process of forming a semiconductor device that is provided on a substrate, the semiconductor device having a source electrode, a drain electrode, a gate electrode, and a first insulating film that covers the drain, the source, and the gate electrodes, the process comprising steps of:
    forming a stopper layer on the first insulating film;
    covering the stopper layer and the first insulating film with a second insulating film;
    preparing a first mask having an edge that overlaps with the stopper layer;
    depositing a seed layer on the first mask and the second insulating film that is exposed from the first mask;
    preparing a second mask having an edge that overlaps with the stopper layer, the edge of the first mask being retreated from the edge of the second mask;
    forming an upper layer on the seed layer by electroplating a metal so as not to overlap with the first mask; and
    removing the seed layer exposed from the upper layer by etching.

2. The process of claim 1,
    wherein the step of removing the seed layer includes a step of continuously removing the seed layer and the second insulating film so as to expose the stopper layer.

3. The process of claim 1,
    further including a step of, after covering the stopper layer and the first insulating film with the second insulating film, exposing the stopper layer by partially removing the second insulating film.

4. The process of claim 3,
    wherein the step of depositing the seed layer further includes a step of depositing the seed layer on the stopper layer.

5. The process of claim 1, wherein the step of preparing the first mask includes steps of:
    patterning the first mask so as to expose a portion of the second insulating film, and
    baking the first mask to dull the edge thereof.

6. The process of claim 1,
    wherein the semiconductor device further includes a source wall,
    wherein the step of forming the stopper layer includes a step of forming the source wall concurrently with the stopper layer, and
    wherein the step of covering the stopper layer by the second insulating film includes a step of covering the source wall concurrently with the stopper layer.

7. The process of claim 1, wherein the step of removing the seed layer exposes the stopper layer between the upper layer and the second insulating film, the process further including steps of, after the step of removing the seed layer,
    removing the first mask exposed from the upper layer, and
    forming a third insulating film so as to fully cover the upper layer, the second insulating film, and the stopper layer exposed between the upper layer and the second insulating film.

8. The process of claim 1, wherein the step of forming the stopper layer includes steps of:
    depositing a metal layer, and
    patterning the metal layer so as to leave the metal layer in a portion between the gate electrode and at least one of the source electrode and the drain electrode.

9. The process of claim 1, further including a step of, after the step of covering the stopper layer by the second insulating film but before the step of preparing the first mask, sequentially removing the second insulating film and the first insulating film in a portion corresponding to at least one of the source electrode and the drain electrode,
    wherein the step of preparing the first mask includes a step of exposing the at least one of source electrode and the drain electrode from the first mask, and
    wherein the step of depositing the seed layer includes a step of covering the at least one of the source electrode and the drain electrode exposed from the first mask by the seed layer.

10. The process of claim 1, wherein the step of depositing the seed layer includes a step of sequentially depositing a refractory metal and a gold (Au) layer by sputtering.

11. The process of claim 10, wherein the step of depositing the refractory metal includes steps of depositing a titanium (Ti) layer by a thickness of 10 nm, depositing a titanium tungsten (TiW) layer by a thickness of 100 nm, and depositing a titanium (Ti) layer by a thickness of 10 nm.

12. The process of claim 10, wherein the step of depositing the seed layer further includes a step of, after the step of depositing the gold (Au) layer, depositing another refractory metal on the gold (Au) layer.

13. The process of claim 10,
    wherein the step of removing the seed layer includes steps of physically etching the gold layer and chemically etching the refractory metal using a reactive gas source, and
    wherein the step of chemically etching the refractory metal includes a step of chemically etching the second insulating film beneath the seed layer.

14. The process of claim 13,
    wherein the step of physically etching the gold layer includes a step of etching the gold layer by ion-milling.

15. The process of claim 13,
    wherein the step of chemically etching the refractory metal includes a step of etching the refractory metal by reacting ion etching (RIE) using a fluorine (F).

16. The process of claim 1, wherein the step of forming an upper layer on the seed layer by electro-plating is a step of forming an interconnection and includes a step of plating a gold (Au) layer by a thickness of 3 μm on the seed layer.

17. The process of claim 1,
wherein the step of forming the stopper layer includes steps of sequentially depositing a titanium (Ti) layer, a gold (Au) layer, and another titanium (Ti) layer by a total thickness of 150 nm.

18. The process of claim 1, wherein the step of covering the stopper layer includes a step of forming the second insulating film with silicon nitride (SiN) and with a thickness of 400 nm.

\* \* \* \* \*